United States Patent [19]

Cho

[11] 4,249,190
[45] Feb. 3, 1981

[54] FLOATING GATE VERTICAL FET

[75] Inventor: Alfred Y. Cho, Summit, N.J.

[73] Assignee: Bell Telephone Laboratories, Incorporated, Murray Hill, N.J.

[21] Appl. No.: 54,822

[22] Filed: Jul. 5, 1979

[51] Int. Cl.³ ............................................ H01L 29/80
[52] U.S. Cl. ........................................ 357/22; 357/68
[58] Field of Search ............................. 357/22, 23, 68

[56] References Cited

U.S. PATENT DOCUMENTS

| | | | |
|---|---|---|---|
| 3,412,297 | 11/1968 | Amlinger | 357/23 |
| 3,639,813 | 2/1972 | Kamoshida et al. | 357/22 |
| 3,896,483 | 7/1975 | Whelan | 357/22 |
| 3,938,241 | 2/1976 | George et al. | 357/22 |
| 3,964,083 | 6/1976 | Lohstroh | 357/22 |
| 4,101,922 | 7/1978 | Tihanyi et al. | 357/22 |
| 4,157,556 | 6/1979 | Decker et al. | 357/22 |

OTHER PUBLICATIONS

IEEE-vol. Ed. 21-No. 1-Jan. 1974, pp. 113-118, Le-Crosnier et al.
IEEE Inter. Solid State Cir. Conf.-Feb. 12, 1975, pp. 66-67, Vergnolle et al.
IEEE Trans. Micro Theory & Tech.-vol. MTT-24, No. 6, Jun. 1976, pp. 305-311, Oakes et al.
Thin Solid Films-vol. 38, 1976, pp. 151-161, Anderson.

Primary Examiner—Edward J. Wojciechowicz
Attorney, Agent, or Firm—Michael J. Urbano

[57] ABSTRACT

A planar field effect transistor (FET) includes a plurality of spaced-apart, floating Schottky barrier, epitaxial metal gate electrodes which are embedded within a semiconductor body. A drain electrode and a gate control electrode are formed on one major surface of the body whereas a source electrode, typically grounded, is formed on an opposite major surface of the body. The FET channel extends vertically between the source and drain, and current flow therein is controlled by application of suitable gate voltage. Two modes of operation are possible: (1) the depletion regions of the control gates and the floating gates pinch off the channel so that with zero control gate voltage no current flows from source to drain; then, forward biasing the control gate opens the channel; and (2) the depletion regions of the control gates and the floating gates do not pinch off the channel, but reverse biasing the control gate produces pinch off. Specifically described is a GaAs FET in which the floating gate electrodes are Al epitaxial layers grown by molecular beam epitaxy.

7 Claims, 5 Drawing Figures

FLOATING GATE VERTICAL FET

BACKGROUND OF THE INVENTION

This invention relates to field effect transistors (FETs) and, more particularly, to vertical FETs.

In a conventional FET, the source, drain, and gate electrodes are arranged on the same major surface of a semiconductor body as depicted in FIG. 1. In general, the gate voltage controls current flow in the semiconductor channel which extends between the source and drain. The performance of an FET depends very much upon the doping profile and quality of the material proximate the surface (i.e., the active layer) and also upon the geometry of the device.

In some applications, e.g., where high power capability is desired, the FETs are connected in parallel with one another. Because all three electrodes are located on the same surface, relatively complicated crossover metallization patterns are required to effect the parallel connections. Elimination of this problem would facilitate large scale integration of FETs.

The geometry of the FET also gives rise to another problem. The gate width $W_g$ (FIG. 1) is very large compared with the gate length $L_g$. Therefore, the gate may be viewed as a transmission line terminated in an open circuit load. A signal impressed at the gate pad is propagated down the long narrow strip of the gate electrode where it experiences attenuation and reflection. As a consequence, the voltage along the gate electrode is different at different sections, and the overall FET may be approximated as many small sections of FETs operating in parallel. Using this approximation, it can be shown that the noise figure of the FET is linearly proportional to the gate length $L_g$. However, state-of-the-art photolithographic fabrication techniques can achieve dimensions only of the order of 1 μm. Smaller dimensions are less reproducible and encounter problems of diffraction and proximity effects. Alternative fabrication techniques, such as X-ray or electron beam exposure, realize smaller dimensions of 0.2 μm, but the resulting high current density in the electrode may cause electromigration problems.

One device suggested in the prior art which might alleviate these problems is known as a "vertical" FET; that is, an FET in which the channel extends vertically and transverse to the active layer of the device rather than horizontally and parallel to that layer. This change in channel orientation can be achieved in different ways. J. G. Oakes et al, *IEEE Transactions on Microwave Theory*, Vol. MTT-24, No. 6, pages 305-311 (1976), fabricated a mesa geometry, vertical MOSFET using an angle evaporation shadow technique to position the gate electrode on the sides of a silicon mesa. The drain electrode was formed on the bottom of the substrate; the source electrode on the top of epitaxial layers grown on the substrate. The effective gate length (on the order of 1 μm) was measured by the thickness of the epitaxial active layer. Because all three electrodes were not formed on the same surface of the device, in one sense parallel interconnection of a plurality of FETs would be facilitated, but in another sense the nonplanar geometry might seriously complicate electrode fabrication.

In contrast, D. L. Lecrosnier et al, *IEEE Transactions on Electron Devices*, Vol. ED-21, No. 1, (1974), utilized high energy ion implantation coupled with planar technology to fabricate a "Gridistor", a vertical multichannel, silicon FET with a p-type buried gate. The gate and source contacts were located on the top major surface of the epitaxial layers whereas the drain was on the bottom of the substrate. These FETs were characterized by a low figure of merit and high gate-to-source capacitance due, in part, to lack of sufficient control (lateral spreading) of implanted boron ions. The asymmetrical distribution of the boron ions also placed a lower limit on the thickness of the buried gate layers.

SUMMARY OF THE INVENTION

In accordance with one embodiment of my invention, a planar vertical FET includes a plurality of spaced-apart, epitaxial metal, floating gate electrodes which are embedded in a semiconductor body and form rectifying barriers therewith. A drain electrode and a control gate electrode are formed on one major surface of an active layer incorporated in the body whereas the source electrode is formed on an opposite major surface of the body, typically on the substrate. Alternatively, the source and gate electrodes may be on the same major surface with the drain on the other major surface. The FET channel extends vertically between the source and drain, and current flow therein is controlled by application of suitable control gate voltage. Two modes of operation are possible: (1) the depletion regions of the control gates and the floating gates pinch off the channel so that with zero control gate voltage no current flows from source to drain; then, forward biasing the control gate causes its depletion region to shrink and the channel to open; and (2) the depletion regions of the control gates and floating gates do not pinch off the channel with zero control gate voltage applied, but reverse biasing the control gate causes its depletion region to expand and to intersect those of the floating gates, thereby pinching off the channel.

In a preferred embodiment, the FET is fabricated of GaAs and the floating gate electrodes are Al epitaxial layers grown on the GaAs active layer by MBE.

BRIEF DESCRIPTION OF THE DRAWING

My invention, together with its various features and advantages, can be readily understood from the following more detailed description taken in conjunction with the accompanying drawing in which.

DETAILED DESCRIPTION

Figure 1:
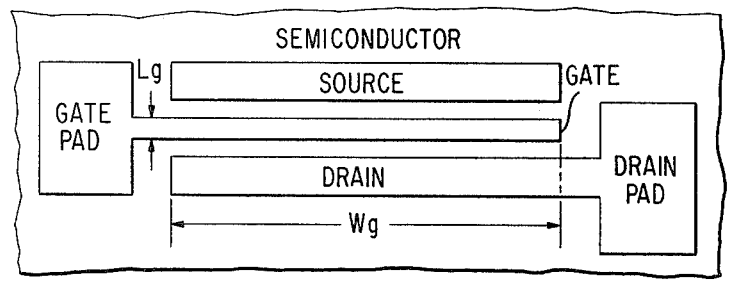
FIG. 1 is a plan view of a prior art FET.
Figure 2:
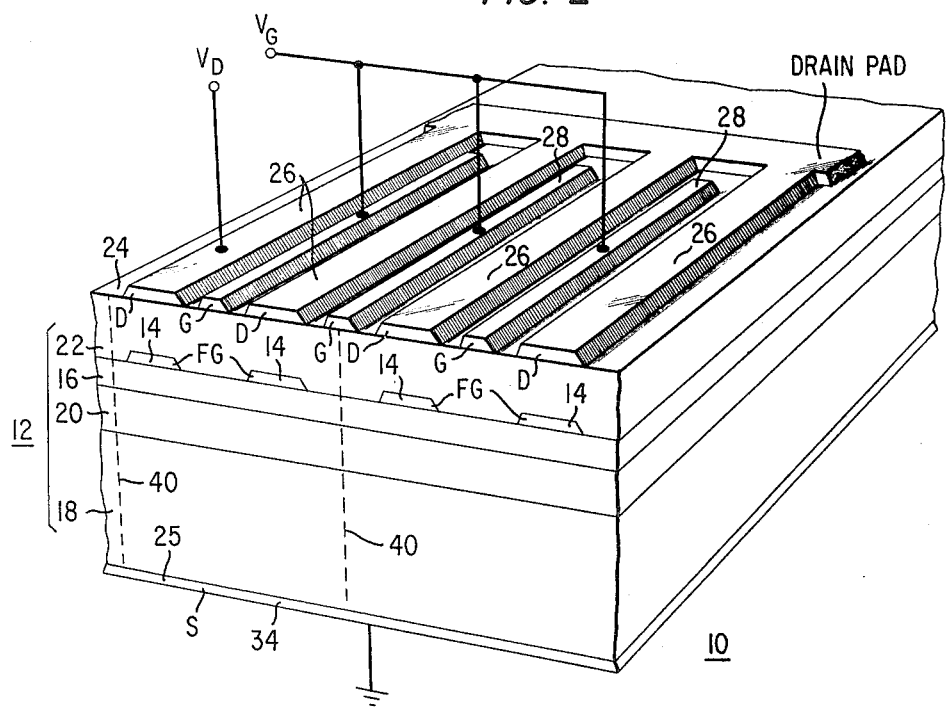
FIG. 2 is an isometric view of a vertical FET in accordance with an illustrative embodiment of my invention.

With reference now to FIG. 2, there is shown a planar, vertical FET 10 comprising a semiconductor body 12 in which a plurality of spaced-apart, metal strips 14 are embedded. The strips 14, which serve as floating gates, form rectifying (e.g., Schottky) barriers at their interfaces with body 12. The latter illustratively comprises a single crystal substrate 18 and the following epitaxial semiconductor layers: an optional buffer layer 20 with a relatively high doping concentration; layer 16 more lightly doped than layer 20; and active layer 22 more lightly doped than layer 16. Design criteria, such as operating frequencies and power output, determine the thickness and carrier concentration of active layer 22.

Figure 3:
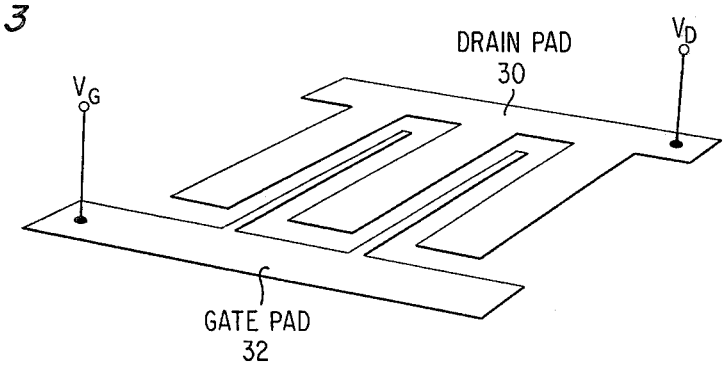
FIG. 3 shows how the drain and gate electrodes of a pair of vertical FETs can be connected in parallel.

On the top major surface 24 of active layer 22, a plurality of elongated drain and control gate electrodes 26 and 28, respectively, are formed. Preferably, these electrodes are interdigitated so that the spaced-apart drain electrodes 26 are in substantial registration with the underlying floating gates 14. For parallel operation of the vertical FETs without the need for crossovers, the drain and control gate electrodes are connected, as shown in FIG. 3, to drain and control gate pads 30 and 32, respectively. A broad area source electrode 34 is formed on the bottom major surface of substrate 18. For common source operation, electrode 34 is grounded. Alternatively, the source and control gate electrodes may be formed on surface 24 with the drain electrode on surface 25.

As depicted, control gate electrodes 28 also form rectifying (e.g., Schottky) barriers at their interfaces with active layer 22 so that the depletion region generated by reversed biasing the control gates, or the carrier injection generated by forward biasing the control gates, can be used to control the flow of current from source to drain in cooperation with the depletion regions surrounding the floating gates 14, as will be discussed more fully hereinafter with reference to FIGS. 4 and 5. However, it should be noted, as is well known in the art, that the control gate of an FET need not be a rectifying barrier, but may take on other configurations such as MOS, in which case an insulating layer would be interposed between the control gate electrodes 28 and active layer 22.

Figure 4:
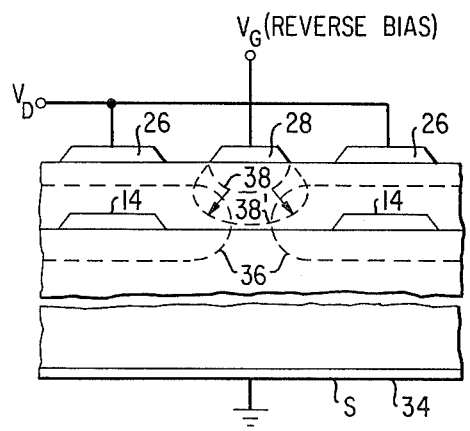
FIG. 4 is a schematic view demonstrating one mode of operation of the FET of FIG. 2 wherein the control gate is reverse biased.

In one mode of operation, depicted in FIG. 4, the depletion regions 36 surrounding adjacent floating gates 14 do not intersect one another, and at one level of gate voltage (e.g., $V_G=0$), a current path or channel exists between the drain electrodes 26 and the source electrode 34. The channel conductance is modulated by applying a suitable reverse bias voltage $V_G$ to the control gate electrode 28 so that its depletion region 38 expands to that shown at 38' and intersects the depletion regions 36 of the floating gates 14. As a consequence, the channel is pinched off and represents a high impedance to the flow of current between the source and drain.

Figure 5:
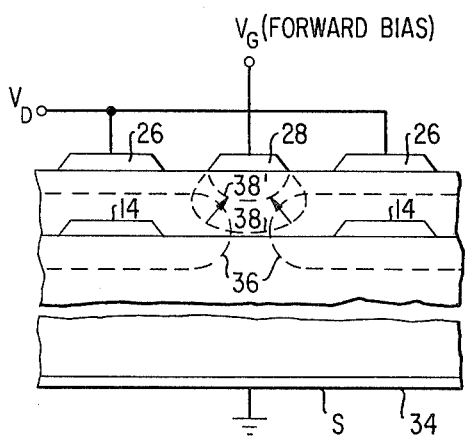
FIG. 5 is a schematic view of the vertical FET of FIG. 2 demonstrating another mode of operation in which the control gate is forward biased.

Alternatively, as depicted in FIG. 5, the floating gates 14 can be designed so that at one level of gate voltage (e.g., $V_G=0$) their depletion regions 36 intersect the depletion region 38 of the control gate 28 and pinch off the channel between the drain electrodes 26 and source electrodes 34. Then, the application of a suitable forward bias voltage $V_G$ causes the depletion region 38 of control gate electrode 28 to shrink to that shown at 38'; i.e., so that depletion region 38' does not intersect depletion regions 36. As a consequence, the channel impedance is reduced and current is allowed to flow between the source 34 and the drain 26.

In an illustrative embodiment, the foregoing vertical FET is fabricated by MBE from the GaAs materials system using Sn as a dopant for n-type semiconductor layers of body 12 and Al for the floating gates 14. Thus, the various layers of body 12 would comprise the following: a (100)-oriented, n-type GaAs substrate doped with silicon or tellurium to about $10^{18}/cm^3$; an n$^{30}$ GaAs buffer layer 20 epitaxially grown on the substrate with a carrier concentration of about $2\times10^{18}/cm^3$ in order to reduce series resistance in accordance with U.S. Pat. No. 3,915,765; an n-type GaAs epitaxial layer 16 doped to about $10^{17}/cm^3$, and an n-type GaAs active layer 22 doped in the range of about $4\times10^{16}$ to $2\times10^{17}/cm^3$ with a thickness of about 2000–8000 Angstroms, depending on design considerations.

Importantly, the floating gates 14 are epitaxially grown on layer 16 using MBE. The top major surface of layer 16 may be masked (e.g., by a mechanical mask) during MBE deposition so that stripe-shaped electrodes 14 are formed directly, or a broad area Al epitaxial layer may be deposited over layer 16 and then etched or patterned using conventional photolithography. The former technique is preferred, however, because it does not require that the Al layer be exposed to the ambient before regrowth of active layer 22 and thereby prevents oxidation of the exposed Al surface. Prevention of such oxidation is important to insure that layer 22 regrows epitaxially over the floating gate electrodes 14. Illustratively, electrodes 14 are 0.1 $\mu$m thick, 2 $\mu$m wide, and are spaced about 3 $\mu$m apart.

Specific growth procedures should be employed in order to insure that both the electrodes 14 and the active layer 22 are single crystalline. Thus, while layer 16 is grown at a typical MBE growth temperature of 560–580 degrees C, the Al layers 14 may be grown epitaxially on GaAs in a range from room temperature to a maximum of about 300 degrees C which minimizes Ga and As diffusion through the Al layer. Growth of Al near room temperature is preferred, however. In addition, it is important to reduce the temperatues of all the other effusion cells, in particular, the As cell, so that the background pressure during deposition of Al is kept at a minimum. This prevents the growth of AlAs which would be polycrystalline at growth temperatures near room temperature. Subsequently, the regrowth of GaAs layer 22 is performed at a temperature substantially lower than that utilized for conventional MBE regrowth. In particular, a growth temperature of about 360–400 degrees C is peferred in order that the regrowth be single crystalline and not polycrystalline. At temperatures above this range, layer 22 would be amorphous due to the deterioration of the Al single crystal layer and below this range twinning is observed.

Finally, the drain and control gate electrodes may be evaporated or otherwise formed using conventional deposition and photolithographic techniques, and the source electrode 34 may be deposited on the substrate to complete the structure as shown in FIG. 2.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, while FIG. 2 was described in terms of a plurality of parallel-connected FETs, it is apparent that discrete devices (similar to FIGS. 4–5) could also be formed by cleaving or otherwise separating the structure along planes 40. In addition, while my invention was exemplified by a GaAs embodiment, it could also be fabricated from other material systems in which the floating gates can be grown as epitaxial metals and the active layer can be epitaxially regrown thereon. Thus, AlGaAs is an appropriate material, and other Group III-V compounds, especially the alloys of GaAs, may also be applicable.

I claim:
1. A field effect transistor (10) comprising
   a body (12) of single crystal semiconductor material having a pair of major surfaces (24, 25),
   a source electrode (34) formed on one major surface (25),
   a drain elctrode (26) formed on the other major surface (24), and
   gate electrode means (28) formed on one of said major surfaces (24) for causing a first depletion region (38) to form within said semiconductor body, the extent of said region being controllable by a voltage ($V_G$) applied to said gate electrode means,
   said field effect transistor characterized by
      a plurality of spaced-apart, metal electrodes (14) embedded within said body, each for providing an electrically floating potential, there between into which the depletion regions (36) of said so as to cause at least second and third depletion regions (36) to form within said body, thereby producing a source electrode-to-drain electrode current flow channel within said body between said second and third depletion regions,
      the flow of current between said source and drain electrodes through said channel being controllable by said voltage ($V_G$) applied to said gate electrode means through the interaction of said first depletion region with said second and third depletion regions.

2. The transistor of claim 1 wherein said embedded metal electrodes comprise single crystal material.

3. The transistor of claim 2 wherein said body comprises a material selected from the group consisting of GaAs and alloys thereof, and said embedded electrode comprises Al.

4. The transistor of claims 1 or 3 wherein said embedded electrode forms a Schottky barrier with said body.

5. The transistor of claim 1 wherein said embedded electrodes comprise elongated parallel stripes, and said drain electrode includes a plurality of elongated parallel stripes in substantial registration with said embedded electrodes.

6. The transistor of claim 3 wherein said semiconductor body comprises
   a GaAs substrate,
   at least one epitaxial GaAs layer grown by molecular beam epitaxy on said substrate, said embedded Al electrodes being formed on said epitaxial layer by molecular beam epitaxy growth at a temperature in the range between room temperature and approximately 300 degrees C, and
   a GaAs single crystal active layer grown by MBE over said embedded electrodes at a temperature of approximately 360–400 degrees C.

7. The transistor of claim 1, 2, 3, 5, or 6 wherein said drain and gate electrodes are formed on the same major surface.

* * * * *

UNITED STATES PATENT AND TRADEMARK OFFICE
CERTIFICATE OF CORRECTION

PATENT NO. : 4,249,190
DATED : February 3, 1981
INVENTOR(S) : Alfred Y. Cho

It is certified that error appears in the above–identified patent and that said Letters Patent are hereby corrected as shown below:

Column 5, lines 20 and 21, after "potential," delete "there between into which the depletion regions (36) of said".

Signed and Sealed this

Ninth Day of June 1981

[SEAL]

Attest:

RENE D. TEGTMEYER

Attesting Officer       Acting Commissioner of Patents and Trademarks